(12) United States Patent
Shakutsui et al.

(10) Patent No.: US 10,950,825 B2
(45) Date of Patent: Mar. 16, 2021

(54) METHOD FOR MANUFACTURING ORGANIC ELECTRONIC DEVICE

(71) Applicant: SUMITOMO CHEMICAL COMPANY, LIMITED, Tokyo (JP)

(72) Inventors: Masato Shakutsui, Niihama (JP);
Masaya Shimogawara, Niihama (JP);
Shinichi Morishima, Tsukuba (JP)

(73) Assignee: SUMITOMO CHEMICAL COMPANY, LIMITED, Tokyo (JP)

( * ) Notice: Subject to any disclaimer, the term of this patent is extended or adjusted under 35 U.S.C. 154(b) by 0 days.

(21) Appl. No.: 16/484,547

(22) PCT Filed: Dec. 19, 2017

(86) PCT No.: PCT/JP2017/045504
§ 371 (c)(1),
(2) Date: Aug. 8, 2019

(87) PCT Pub. No.: WO2018/146950
PCT Pub. Date: Aug. 16, 2018

(65) Prior Publication Data
US 2020/0058907 A1    Feb. 20, 2020

(30) Foreign Application Priority Data

Feb. 9, 2017    (JP) .............................. JP2017-022386

(51) Int. Cl.
*H01L 51/56* (2006.01)
*H01L 51/50* (2006.01)
(Continued)

(52) U.S. Cl.
CPC .......... *H01L 51/56* (2013.01); *H01L 51/0028* (2013.01); *H01L 51/0097* (2013.01); *H01L 51/5246* (2013.01)

(58) Field of Classification Search
CPC . H01L 51/0028; H01L 51/5246; H05B 33/02; H05B 33/10
See application file for complete search history.

(56) References Cited

U.S. PATENT DOCUMENTS

2004/0206307 A1* 10/2004 Boroson ........... H01L 21/67161
                                                      118/719
2006/0269656 A1* 11/2006 Boroson ............. H01L 51/0025
                                                       427/66
(Continued)

FOREIGN PATENT DOCUMENTS

CN    101916022 A    12/2010
CN    102596565 A    7/2012
(Continued)

OTHER PUBLICATIONS

Machine translation of JP2013-073001 A (Sakano et al), 11 pages(Apr. 2013) . . . (Year: 2013).*
(Continued)

*Primary Examiner* — Caridad Everhart
(74) *Attorney, Agent, or Firm* — Birch, Stewart, Kolasch & Birch, LLP (57) ABSTRACT

A manufacturing method of an organic electronic device of the present invention, includes: a removing step of removing a volatile component from a flexible base material; a fixing step of fixing the flexible base material onto a support substrate via an adhesive layer; and a forming step of forming a device main body sequentially including a first electrode layer, at least one organic functional layer, and a second electrode layer on the flexible base material that is fixed onto the support substrate, on a side opposite to the support substrate, in this order, in which a vapor pressure of the volatile component is greater than or equal to 101325 Pa (Continued)

within a temperature range from 20° C. to a melting point of a parent resin of the flexible base material.

8 Claims, 2 Drawing Sheets

(51) Int. Cl.
*H01L 51/00* (2006.01)
*H01L 51/52* (2006.01)

(56) References Cited

U.S. PATENT DOCUMENTS

| | | | |
|---|---|---|---|
| 2012/0156457 A1 | 6/2012 | Kondo | |
| 2013/0078752 A1 | 3/2013 | Sakano et al. | |
| 2014/0377939 A1* | 12/2014 | Khachatryan | G02F 1/133305 438/479 |
| 2015/0187849 A1 | 7/2015 | Kachatryan et al. | |
| 2015/0270323 A1* | 9/2015 | Cho | H01L 27/3272 257/40 |
| 2015/0372255 A1* | 12/2015 | Fukumoto | H01L 51/5246 257/40 |
| 2017/0200891 A1 | 7/2017 | Suga et al. | |
| 2018/0002567 A1* | 1/2018 | Huang | H05K 3/282 |

FOREIGN PATENT DOCUMENTS

| | | |
|---|---|---|
| CN | 104485344 A | 4/2015 |
| CN | 105474139 A | 4/2016 |
| JP | 2001-313165 A | 11/2001 |
| JP | 3949045 B2 | 7/2007 |
| JP | 2008-123948 A | 5/2008 |
| JP | 2013-73001 A | 4/2013 |
| JP | 2016-21384 A | 2/2016 |
| JP | 2016-531358 A | 10/2016 |
| WO | WO 2005/094132 A1 | 10/2005 |
| WO | WO 2015/194557 A1 | 12/2015 |
| WO | WO 2016/010106 A1 | 1/2016 |

OTHER PUBLICATIONS

English translation of the International Preliminary Report on Patentability and Written Opinion of the International Searching Authority, dated Aug. 22, 2019, for International Application No. PCT/JP2017/045504.
English translation of the International Search Report, dated Apr. 3, 2018, for International Application No. PCT/JP2017/045504.
Japanese Notice of Reasons for Rejection dated May 19, 2020, for Japanese Application No. 2017-022386, with an English translation.
Extended European Search Report dated Oct. 9, 2020 for Application No. 17896111.6.
Chinese First Office Action and Search Report (including an English translation thereof) issued in the corresponding Chinese Patent Application No. 201780086039.1 dated Dec. 31, 2020.

* cited by examiner

METHOD FOR MANUFACTURING ORGANIC ELECTRONIC DEVICE

TECHNICAL FIELD

The present invention relates to a manufacturing method of an organic electronic device.

BACKGROUND ART

An organic electronic device such as an organic electroluminescence device (hereinafter, may be referred to as an "organic electro luminescence (EL) device"), an organic photoelectric conversion element, and an organic thin film transistor includes an organic thin film having a predetermined function, and the organic thin film is supported on a flexible base material.

As a method of manufacturing the organic electronic device, a solution of a functional material is applied onto the flexible base material, and then, is heated, and thus, a functional layer such as a light emitting layer is sequentially formed, and the organic electronic device is manufactured (Patent Literature 1).

CITATION LIST

Patent Literature

Patent Literature 1: Japanese Patent No. 3949045

SUMMARY OF INVENTION

Technical Problem

Here, a method is known in which the flexible base material is fixed onto a support substrate having rigidity, such as a glass plate via an adhesive agent, and then, the organic electronic device is manufactured on the flexible base material. In a case where the organic electronic device is manufactured by such a method, the flexible base material partially rises up from the support substrate during the manufacturing, and thus, there is a case where the light emitting layer or the like is not capable of being homogeneously formed, and a failure such as the occurrence of a bonding defect in a sealing member occurs, and there is also a problem that the appearance of the organic electronic device after the flexible base material is peeled off from the support substrate is degraded.

The present invention has been made in consideration of the problems described above, and an object thereof is to provide a manufacturing method of an organic electronic device that is capable of manufacturing a high-grade organic electronic device by preventing the flexible base material from partially rising up from the support substrate during the manufacturing.

Solution to Problem

A manufacturing method of an organic electronic device of the present invention, includes: a removing step of removing a volatile component from a flexible base material; a fixing step of fixing the flexible base material onto a support substrate via an adhesive layer; and a forming step of forming a device main body portion sequentially including a first electrode layer, at least one organic functional layer, and a second electrode layer on the flexible base material that is fixed onto the support substrate, on a side opposite to the support substrate, in this order, in which a vapor pressure of the volatile component is greater than or equal to 101325 Pa within a temperature range from 20° C. to a melting point of a parent resin of the flexible base material.

The manufacturing method of an organic electronic device of the present invention includes a step of removing the volatile component from the flexible base material, and thus, it is possible to manufacture a high-grade organic electronic device by preventing the flexible base material from partially rising up from the support substrate during the manufacturing.

Furthermore, a portion of the organic electronic device excluding the flexible base material will be referred to as a device main body portion.

It is preferable that a step of peeling off the flexible base material from the support substrate is further provided after the forming step.

The flexible base material is peeled off from the support substrate after the forming step, and thus, it is possible to manufacture an organic electronic device having high flexibility.

It is preferable that the flexible base material includes a barrier layer having a moisture vapor transmission rate of less than or equal to $1 \times 10^{-4}$ g/m$^2$/day, on a surface on the device main body portion side.

In a case where the barrier layer having a low moisture vapor transmission rate is provided on the surface on the device main body portion side, and a volatile component is generated from the flexible base material during the manufacturing, the volatile component is not capable of being transmitted from the surface on the device main body portion side, and thus, the volatile component is easily remains between the support substrate and the flexible base material, compared to a case using a flexible base material not including the barrier layer. For this reason, the flexible base material more easily rises up from the support substrate. However, the manufacturing method of an organic electronic device of the present invention includes the removing step, and thus, even in a case where the flexible base material includes the barrier layer on the surface on the device main body portion side, it is possible to manufacture a high-grade organic electronic device by preventing the flexible base material from partially rising up from the support substrate.

It is preferable that the forming step includes a step of performing heating at a temperature of higher than or equal to a glass transition point of the flexible base material.

In a case where the heating is performed at a temperature of higher than or equal to the glass transition point of the flexible base material, the flexible base material is softened, and thus, easily rises up from the support substrate. However, the manufacturing method of an organic electronic device of the present invention includes the removing step, and thus, even in a case where the step of heating is performed at a temperature of higher than or equal to the glass transition point of the flexible base material, it is possible to manufacture a high-grade organic electronic device by preventing the flexible base material from partially rising up from the support substrate.

It is preferable that the forming step includes a step of forming at least one organic functional layer by a coating method.

It is difficult to form an organic functional layer having a homogeneous film thickness by the coating method unless a surface to be coated is flat. However, the manufacturing method of an organic electronic device of the present invention is capable of preventing the flexible base material from partially rising up from the support substrate, and of making the surface of the flexible base material flat, and thus, even in a case where the organic functional layer is formed by the coating method, it is possible to form a layer having a homogeneous film thickness. Therefore, it is possible to manufacture a high-grade organic electronic device.

Furthermore, the coating method is a method of forming the organic functional layer by applying a liquid containing a material for forming the organic functional layer onto a coating surface of a coating target including the flexible base material, by forming a coating film containing the material, and by drying the coating film.

It is preferable that the coating method is an ink jet printing method.

In the ink jet printing method, an ink having a low viscosity is usually used as a liquid containing a material for forming each layer, and thus, in a case where a surface to be coated with the ink is not flat, unevenness easily occurs. However, the manufacturing method of an organic electronic device of the present invention is capable of preventing the flexible base material from partially rising up from the support substrate, and of making the surface of the flexible base material flat, and thus, the unevenness hardly occurs, and it is possible to manufacture a high-grade organic electronic device.

It is preferable that in the removing step, the flexible base material is heated within a temperature range of higher than or equal to 20° C. and lower than the glass transition point of the flexible base material, under a reduced pressure or under an inert gas atmosphere. The flexible base material is heated within the temperature range of higher than or equal to 20° C. and lower than the glass transition point of the flexible base material, and thus, it is possible to effectively remove the volatile component without causing deformation such as wrinkles in the flexible base material.

It is preferable that the fixing step is performed under a reduced pressure or under an inert gas atmosphere, after the removing step.

The fixing step is performed under a reduced pressure or under an inert gas atmosphere even after the removing step, and thus, it is possible to prevent the volatile component that is removed in the removing step from being absorbed again in the flexible base material, and to manufacture a higher-grade organic electronic device.

It is preferable that the manufacturing method of an organic electronic device of the present invention, further includes: a step of removing the volatile component from the adhesive layer, before the fixing step.

In a case where the adhesive layer contains the volatile component, the step of removing the volatile component from the adhesive layer is performed before the fixing step, and thus, it is possible to further prevent the flexible base material from partially rising up from the support substrate, and to manufacture a higher-grade organic electronic device.

Advantageous Effects of Invention

According to the present invention, it is possible to provide a manufacturing method of an organic electronic device that is capable of manufacturing a high-grade organic electronic device by preventing the flexible base material from partially rising up from the support substrate during the manufacturing.

DESCRIPTION OF EMBODIMENTS

Hereinafter, an embodiment of the present invention will be described with reference to the drawings. The same reference numerals will be applied to the same constituents. The repeated description will be omitted. It is not necessary that a dimensional ratio of the drawings is coincident with the described ratio. In the description, a word indicating a direction such as "up" and "down" is a convenient word based on a state illustrated in the drawings.

Figure 1:
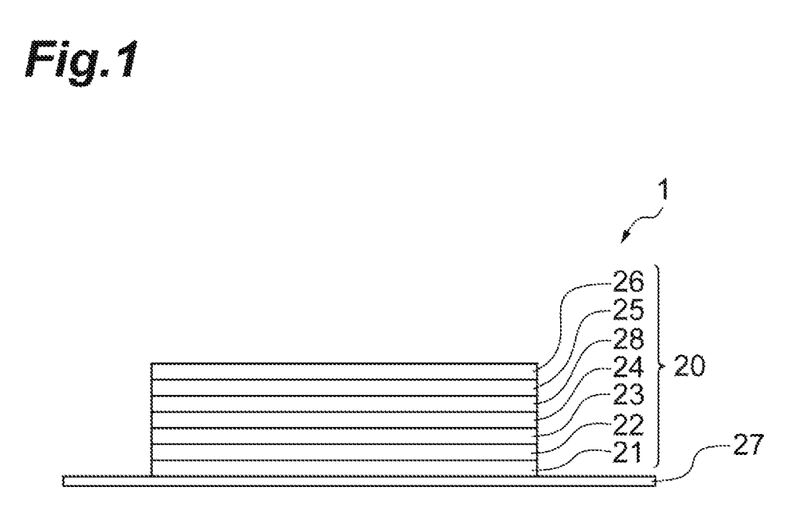
FIG. 1 is a diagram schematically illustrating an example of a configuration of an organic EL device that is one embodiment of an organic electronic device according to the present invention.

Hereinafter, an organic EL device including a positive electrode layer as a first electrode layer, at least one organic functional layer, and a negative electrode layer as a second electrode layer will be described as an example of this embodiment. An example of an organic electronic device according to this embodiment is an organic EL device 1 that is schematically illustrated in FIG. 1. The organic EL device 1 can be suitably used in a curved or flat illuminating device, for example, a planar light source that is used as a light source of a scanner, and a display device.

As illustrated in FIG. 1, the organic EL device 1 includes a flexible base material 27, and a positive electrode layer 21, a hole injection layer 22, a hole transport layer 23, a light emitting layer 24, an electron transport layer 28, an electron injection layer 25, and a negative electrode layer 26 that are sequentially provided from the flexible base material 27 side. A laminated body including the positive electrode layer 21, the hole injection layer 22, the hole transport layer 23, the light emitting layer 24, the electron transport layer 28, the electron injection layer 25, and the negative electrode layer 26 will be also referred to as a device main body portion 20.

A thin film including the hole injection layer 22, the hole transport layer 23, the light emitting layer 24, the electron transport layer 28, and the electron injection layer 25 is a functional layer having each predetermined function, and at least one of the functional layers is an organic functional layer that is a layer containing an organic compound. In FIG. 1, even though it is not illustrated, the organic functional layer is degraded by moisture, and thus, in general, the organic EL device 1 is sealed with a sealing member (for example, glass, a metal foil, and the like).

The organic EL device 1 may be a device including the negative electrode layer as the first electrode layer, and the positive electrode layer as the second electrode layer. In addition, the organic EL device 1 may be a bottom emission type organic EL device, that is, in the configuration illustrated in FIG. 1, a mode in which light emitted from the light emitting layer 24 exits through the flexible base material 27, or may be a top emission type organic EL device, that is, in the configuration illustrated in FIG. 1, a mode in which light emitted from the light emitting layer 24 exits from a side opposite to the flexible base material 27 (that is, from a negative electrode E2 side). In the following description, unless otherwise noted, the organic EL device 1 is a bottom emission type organic EL device.

<Flexible Base Material>

It is preferable that the flexible base material 27 contains a plastic material that substantially transmits visible light (for example, light having a wavelength of 360 nm to 830 nm) that is emitted from the light emitting layer 24. It is preferable that the flexible base material 27 is colorless and transparent with respect to light that is emitted from the light emitting layer 24. Furthermore, in a case where the transparency of the flexible base material 27 is not required in use application of the organic electronic device, the flexible base material 27 may not be transparent with respect to visible light.

Examples of the flexible base material 27 include a plastic film. Examples of a parent resin of the flexible base material 27 include polyether sulfone (PES); a polyester resin such as polyethylene terephthalate (PET) and polyethylene naphthalate (PEN); a polyolefin resin such as polyethylene (PE), polypropylene (PP), and cyclic polyolefin; a polyamide resin; a polycarbonate resin; a polystyrene resin; a polyvinyl alcohol resin; a saponified product of an ethylene-vinyl acetate copolymer; a polyacrylonitrile resin; an acetal resin; a polyimide resin; an epoxy resin, and the like.

Among such resins, the polyester resin or the polyolefin resin is preferable, and the polyethylene terephthalate or the polyethylene naphthalate is more preferable, since heat resistance is high, a linear expansion coefficient is low, and a manufacturing cost is low. In addition, only one type of such resins may be used, or two or more types thereof may be used by being combined.

The thickness of the flexible base material 27 is not particularly limited, and for example, is greater than or equal to 10 μm and less than or equal to 1 mm.

A driving circuit for driving the organic EL device 1 (for example, a circuit including a thin film transistor or the like) may be formed in the flexible base material 27.

The flexible base material 27 may further include a barrier layer having a moisture vapor transmission rate of less than or equal to $1\times10^{-4}$ g/m²/day. Furthermore, the moisture vapor transmission rate, for example, can be measured by a calcium corrosion test. The barrier layer may have a gas (for example, oxygen) barrier function in addition to a moisture barrier function. The barrier layer, for example, can be a film formed of silicon, oxygen, and carbon, a film formed of silicon, oxygen, carbon, and nitrogen, or a film formed of a metal oxide. Specifically, silicon oxide, silicon nitride, silicon oxynitride, aluminum oxide, and the like are exemplified. An example of the thickness of the barrier layer is greater than or equal to 10 nm and less than or equal to 10 μm.

<Positive Electrode Layer>

An electrode layer having light transmittivity may be used in the positive electrode layer 21. A thin film of a metal oxide, a metal sulfide, a metal, and the like having a high electric conductivity can be used as the electrode having light transmittivity, and a thin film having a high light transmission rate is preferably used. For example, thin films formed of indium oxide, zinc oxide, tin oxide, ITO, indium zinc oxide (simply referred to as IZO), gold, platinum, silver, copper, and the like are used, and among them, the thin film formed of ITO, IZO, or tin oxide is preferably used.

A transparent conductive film of an organic substance such as polyaniline or a derivative thereof, and polythiophene or a derivative thereof may be used as the positive electrode layer 21.

The thickness of the positive electrode layer 21 can be suitably determined in consideration of the transmittivity of light, the electric conductivity, and the like. The thickness of the positive electrode layer 21, for example, is 10 nm to 10 μm, is preferably 20 nm to 1 μm, and is more preferably 50 nm to 500 nm.

Examples of a forming method of the positive electrode layer 21 are capable of including a vacuum vapor deposition method, a sputtering method, an ion plating method, a plating method, a coating method (for example, an ink jet printing method), and the like. It is preferable that the transparent conductive film is formed by the coating method (for example, the ink jet printing method). Furthermore, the coating method is a method of forming the transparent conductive film (the positive electrode layer 21) by applying a liquid containing a material for forming the transparent conductive film (the positive electrode layer 21) onto a coating surface of a coating target including the flexible base material, by forming a coating film containing the material, and by drying the coating film.

<Hole Injection Layer>

The hole injection layer 22 is a layer having a function of improving a hole injection efficiency from the positive electrode layer 21. A hole injection material configuring the hole injection layer 22 is sorted into a low-molecular compound and a high-molecular compound. The hole injection material may have a crosslinkable group.

Examples of the low-molecular compound include a metal oxide such as vanadium oxide, molybdenum oxide, ruthenium oxide, and aluminum oxide, a metal phthalocyanine compound such as copper phthalocyanine, carbon, and the like.

Examples of the high-molecular compound include a polythiophene derivative such as polyaniline, polythiophene, and polyethylene dioxythiophene (PEDOT), polypyrrole, polyphenylene vinylene, polythienylene vinylene, polyquinoline, polyquinoxaline, and derivatives thereof; and a conductive polymer such as a polymer having an aromatic amine structure on a main chain or a side chain.

An optimal value of the thickness of the hole injection layer 22 is different in accordance with a material to be used, and thus, the thickness of the hole injection layer 22 is suitably determined in consideration of properties to be obtained, the simplicity of film formation, and the like. The thickness of the hole injection layer 22, for example, is 1 nm to 1 μm, is preferably 2 nm to 500 nm, and is more preferably 5 nm to 200 nm.

The hole injection layer 22, for example, is formed by the coating method (for example, the ink jet printing method). In addition, the hole injection layer 22 may be formed by a predetermined known method that is different from the coating method. When the hole injection layer is formed by the coating method, there is a case where it is necessary to perform heat activation after a coating film containing the hole injection material is formed by applying a liquid in which the hole injection material is dissolved in a solvent, and by drying the coating film. The activation indicates that the hole injection layer 22 is allowed to exhibit an electronic accepting function that the hole injection layer 22 should have. The activation tends to be performed for a short period of time as the temperature of heat to be applied increases. In a case where the heat activation is necessary, for example, a method of applying heat of higher than or equal to a glass transition point of the flexible base material 27 is used.

<Hole Transport Layer>

The hole transport layer 23 has a function of receiving a hole from the hole injection layer 22 (or in a case where there is no hole injection layer 22, the positive electrode layer 21), and of transporting the hole to the light emitting layer 24.

The hole transport layer 23 contains a hole transport material. The hole transport material is not particularly limited insofar as the hole transport material is an organic compound having a hole transport function. Specific examples of the organic compound having a hole transport function include polyvinyl carbazole or a derivative thereof, polysilane or a derivative thereof, a polysiloxane derivative having an aromatic amine residue on a side chain or a main chain, a pyrazoline derivative, an aryl amine derivative, a stilbene derivative, a triphenyl diamine derivative, polyaniline or a derivative thereof, polythiophene or a derivative thereof, polypyrrole or a derivative thereof, polyaryl amine or a derivative thereof, poly(p-phenylene vinylene) or a derivative thereof, a polyfluorene derivative, a high-molecular compound having an aromatic amine residue, and poly (2,5-thienylene vinylene) or a derivative thereof.

Examples of the hole transport material also include hole transport materials and the like described in Japanese Unexamined Patent Application Publication No. S63-70257, Japanese Unexamined Patent Application Publication No. S63-175860, Japanese Unexamined Patent Application Publication No. H2-135359, Japanese Unexamined Patent Application Publication No. H2-135361, Japanese Unexamined Patent Application Publication No. H2-209988, Japanese Unexamined Patent Application Publication No. H3-37992, and Japanese Unexamined Patent Application Publication No. H3-152184.

The hole transport layer 23, for example, is formed by the coating method (for example, the ink jet printing method). In addition, the hole transport layer 23 may be formed by a predetermined known method that is different from the coating method.

A solvent that is used in the coating method is not particularly limited insofar as the solvent dissolves the hole transport material. Examples of the solvent include a chloride solvent such as chloroform, methylene chloride, and dichloroethane, an ether solvent such as tetrahydrofuran, an aromatic hydrocarbon solvent such as toluene and xylene, a ketone solvent such as acetone and methyl ethyl ketone, and an ester solvent such as ethyl acetate, butyl acetate, and ethyl cellosolve acetate.

The hole transport material may contain a material having a crosslinkable group. The material having a crosslinkable group may be a hole transport material (an organic material) having a crosslinkable group, or may be a material containing a hole transport material not having a crosslinkable group and a crosslinking agent having a crosslinkable group.

When the hole transport material contains the material having a crosslinkable group, and the hole transport layer is formed by the coating method, it is possible to promote a crosslinking reaction by performing a heating treatment after a coating film containing the hole transport material is formed by applying a liquid in which the hole transport material is dissolved in the solvent, and the coating film is dried. The crosslinking reaction tends to be performed for a short period of time as a temperature at the time of performing the heating increases, and thus, the heating may be performed at a temperature of higher than or equal to the glass transition point of the flexible base material 27.

An optimal value of the thickness of the hole transport layer 23 is different in accordance with a material to be used, and thus, the thickness of the hole transport layer 23 may be selected such that a driving voltage and a light emitting efficiency have a suitable value. A thickness in which at least a pinhole is not generated is necessary for the hole transport layer 23, and in a case where the thickness is excessively large, there is a concern that the driving voltage of the organic EL device 1 increases. The thickness of the hole transport layer 23, for example, is 1 nm to 1 µm, is preferably 2 nm to 500 nm, and is more preferably 5 nm to 200 nm.

<Light Emitting Layer>

In general, the light emitting layer 24 mainly contains an organic substance emitting fluorescence and/or phosphorescence, or the organic substance and a dopant material for a light emitting layer that aids the organic substance. The dopant material for a light emitting layer, for example, is added in order to improve a light emitting efficiency or to change a light emitting wavelength. Furthermore, a high-molecular compound is preferable as the organic substance, from the viewpoint of solubility. It is preferable that the light emitting layer 24 contains a high-molecular compound having a number average molecular weight of 103 to 108 in terms of polystyrene. Examples of a light emitting material configuring the light emitting layer 24 are capable of including the following organic substance emitting the fluorescence and/or the phosphorescence, such as a dye material, a metal complex material, and a high-molecular material, the following dopant material for a light emitting layer, and the like.

(Dye Material)

Examples of the dye material are capable of including a cyclopentamine derivative, a tetraphenyl butadiene derivative, a triphenyl amine derivative, an oxadiazole derivative, a pyrazoloquinoline derivative, a distyryl benzene derivative, a distyryl arylene derivative, a pyrrole derivative, a thiophene ring compound, a pyridine ring compound, a perinone derivative, a perylene derivative, an oligothiophene derivative, an oxadiazole dimer, a pyrazoline dimer, a quinacridone derivative, a coumarin derivative, and the like.

(Metal Complex Material)

Examples of the metal complex material are capable of including a rare earth metal such as Tb, Eu, and Dy, or a metal complex having Al, Zn, Be, Pt, Ir, or the like as a central metal, and oxadiazole, thiadiazole, phenyl pyridine, phenyl benzimidazole, a quinoline structure, or the like as a ligand. Examples of the metal complex are capable of including a metal complex emitting light from a triplet excitation state, such as an iridium complex and a platinum complex, an aluminum quinolinol complex, a benzoquinolinol beryllium complex, a benzooxazolyl zinc complex, benzothiazole zinc complex, an azomethyl zinc complex, a porphyrin zinc complex, a phenanthroline europium complex, and the like.

(High-Molecular Material)

Examples of the high-molecular material are capable of including a polyparaphenylene vinylene derivative, a polythiophene derivative, a polyparaphenylene derivative, a polysilane derivative, a polyacetylene derivative, a polyfluorene derivative, a polyvinyl carbazole derivative, the dye material, a material in which a metal complex material is polymerized, and the like.

(Dopant Material for Light Emitting Layer)

Examples of the dopant material for a light emitting layer are capable of including a perylene derivative, a coumarin derivative, a rubrene derivative, a quinacridone derivative, a squarylium derivative, a porphyrin derivative, a styryl dye, a tetracene derivative, a pyrazolone derivative, decacyclene, phenoxazone, and the like.

The thickness of the light emitting layer 24 is generally approximately 2 nm to 200 nm. The light emitting layer 24, for example, is foamed by the coating method (for example, the ink jet printing method) using a coating liquid containing the light emitting material as described above. A solvent of the coating liquid containing the light emitting material is not particularly limited insofar as the solvent dissolves the light emitting material, and for example, may be the solvent of the coating liquid for forming the hole transport layer 23.

<Electron Transport Layer>

The electron transport layer 28 has a function improving an electron injection efficiency with respect to the light emitting layer 24 from the negative electrode layer 26, or the electron transport layer 28 closer to the electron injection layer 25 or the negative electrode layer 26. The electron transport layer 28 can be formed by a predetermined known method such as a vapor deposition method, a sputtering method, and a coating method (for example, an ink jet printing method). The thickness of the electron transport layer 28 is suitably set in consideration of electric properties, the easiness of film formation, and the like, and for example, is 1 nm to 1 µm, is preferably 2 nm to 500 nm, and is more preferably 5 nm to 200 nm.

A known material can be used in an electron transport material configuring the electron transport layer 28. Examples of the electron transport material configuring the electron transport layer 28 include a metal complex such as an oxadiazole derivative, anthraquinodimethane or a derivative thereof, benzoquinone or a derivative thereof, naphthoquinone or a derivative thereof; anthraquinone or a derivative thereof; tetracyanoanthraquinodimethane or a derivative thereof, a fluorenone derivative, diphenyl dicyanoethylene or a derivative thereof, a diphenoquinone derivative, or 8-hydroxy quinoline or a derivative thereof, polyquinoline or a derivative thereof, polyquinoxaline or a derivative thereof, polyfluorene or a derivative thereof, and the like.

<Electron Injection Layer>

The electron injection layer 25 has a function of improving an electron injection efficiency from the negative electrode layer 26. An optimal material is suitably selected in accordance with the type of the light emitting layer 24, as a material configuring the electron injection layer 25. Examples of the material configuring the electron injection layer 25 are capable of including an alkali metal, an alkali earth metal, an alloy containing one type of an alkali metal and an alkali earth metal, an oxide, a halogenide, and a carbonate of an alkali metal or an alkali earth metal, or a mixture of such substances, and the like. Examples of the oxide, the halogenide, and the carbonate of the alkali metal or the alkali metal are capable of including lithium, sodium, potassium, rubidium, cesium, lithium oxide, lithium fluoride, sodium oxide, sodium fluoride, potassium oxide, potassium fluoride, rubidium oxide, rubidium fluoride, cesium oxide, cesium fluoride, lithium carbonate, and the like. In addition, examples of the oxide, the halogenide, and the carbonate of the alkali earth metal or the alkali earth metal are capable of including magnesium, calcium, barium, strontium, magnesium oxide, magnesium fluoride, calcium oxide, calcium fluoride, barium oxide, barium fluoride, strontium oxide, strontium fluoride, magnesium carbonate, and the like.

In addition, a layer in which an organic material having electron transport properties that is known in the related art, and an organic metal complex of an alkali metal are mixed can be used as the electron injection layer 25.

The electron injection layer 25 can be formed by a predetermined known method such as a vapor deposition method, a sputtering method, and a coating method (for example, an ink jet printing method). It is preferable that the thickness of the electron injection layer 25 is approximately 1 nm to 1 µm.

<Negative Electrode Layer>

A material that has a small work function, is easily injects an electron into the light emitting layer 24, and has a high electric conductivity is preferable as the material of the negative electrode layer 26. In addition, in the organic EL device 1 extracting light from the positive electrode layer 21 side, it is preferable that light that is emitted from the light emitting layer 24 is reflected on the positive electrode layer 21 side by the negative electrode layer 26 in order to improve the light emitting efficiency, and thus, a material having a high visible light reflection rate is preferable as the material of the negative electrode layer 26.

For example, an alkali metal, an alkali earth metal, a transition metal, a group 13 metal in the periodic table, and the like can be used as the material of the negative electrode layer 26. For example, metals such as lithium, sodium, potassium, rubidium, cesium, beryllium, magnesium, calcium, strontium, barium, aluminum, scandium, vanadium, zinc, yttrium, indium, cerium, samarium, europium, terbium, and ytterbium, an alloy of two or more types of the metals, an alloy of one type of the metals, and one type of gold, silver, platinum, copper, manganese, titanium, cobalt, nickel, tungsten, and tin, graphite or a graphite interlayer compound, and the like are used as the material of the negative electrode layer 26. Examples of the alloy are capable of including a magnesium-silver alloy, a magnesium-indium alloy, a magnesium-aluminum alloy, an indium-silver alloy, a lithium-aluminum alloy, a lithium-magnesium alloy, a lithium-indium alloy, a calcium-aluminum alloy, and the like.

In addition, transparent conductive electrode formed of a conductive metal oxide, a conductive organic substance, and the like can be used as the negative electrode layer 26.

Specifically, examples of the conductive metal oxide are capable of including indium oxide, zinc oxide, tin oxide, ITO, and IZO, and examples of the conductive organic substance are capable of including polyaniline or a derivative thereof, polythiophene or a derivative thereof, and the like. Furthermore, the negative electrode layer 26 may be configured of a laminated body in which two or more layers are laminated. Furthermore, there is also a case where the electron injection layer 25 is used as the negative electrode layer 26.

The thickness of the negative electrode layer 26 is suitably set in consideration of the electric conductivity and durability. The thickness of the negative electrode layer 26, for example, is 10 nm to 10 µm, is preferably 20 nm to 1 µm, and is more preferably 50 nm to 500 nm.

Examples of a forming method of the negative electrode layer 26 are capable of including a vacuum vapor deposition method, a sputtering method, a laminating method in which a metal thin film is subjected to thermal compression bonding, a coating method (for example, an ink jet printing method), and the like.

<Manufacturing Method of Organic EL Device>

Hereinafter, a manufacturing method according to this embodiment will be described by using FIG. 2. The manufacturing method of the organic EL device of this embodiment includes a removing step of removing a volatile component from the flexible base material, a fixing step of fixing the flexible base material after the removing step (hereinafter, simply referred to as the flexible base material 27) onto a support substrate 10 via the adhesive layer 12, and a forming step of forming the device main body portion 20 on the flexible base material 27 that is fixed onto the support substrate 10 (on a side opposite to the support substrate 10), in this order.

<Removing Step>

First, the volatile component is removed from the flexible base material. The flexible base material from which the volatile component is removed, is the flexible base material 27 illustrated in FIGS. 1 and 2. Examples of a specific method for removing the volatile component from the flexible base material include a method of heating the flexible base material in an oven or the like, a method of irradiating the surface of the flexible base material with an infrared ray, and the like. In a case where the flexible base material is heated in an oven or the like, it is preferable that a heating temperature is higher than or equal to 20° C. and lower than the glass transition point of the flexible base material from the viewpoint of suppressing deformation in the flexible base material, and it is preferable that the heating temperature is a temperature close to the glass transition point from the viewpoint of suppressing deformation in the flexible base material and of increasing a removing efficiency. In a case where the flexible base material is irradiated with an infrared ray, the wavelength of the infrared ray is preferably 1.0 μm to 4.0 μm, and is more preferably 1.5 μm to 3.5 μm. It is preferable that the heating or the infrared ray irradiation is performed under a reduced pressure or under an inert gas atmosphere of nitrogen gas or the like. Furthermore, it is sufficient that the removing step is a step for removing the volatile component from the flexible base material, and may not be a step for completely removing the volatile component from the flexible base material. That is, the volatile component may not be completely removed from the flexible base material after the removing step.

The volatile component having a vapor pressure of greater than or equal to 101325 Pa within the temperature range from 20° C. (a room temperature) to the melting point of the parent resin of the flexible base material is contained in the flexible base material before the removing step is performed. That is, the vapor pressure of the volatile component reaches an atmospheric pressure of 101325 Pa at any temperature within the temperature range from 20° C. to the melting point of the parent resin of the flexible base material. Examples of such a volatile component include water, an organic solvent, and the like. Such a volatile component is mixed into the flexible base material at the time of manufacturing or storing the flexible base material. Here, the parent resin indicates a component excluding components other than a resin in components configuring the flexible base material.

Examples of a measurement method of the inciting point of the parent resin and the glass transition point of the flexible base material include a method using a differential scanning calorimeter.

By including such a removing step, it is possible to reduce in advance the volatile component contained in the flexible base material, and it is possible to suppress the generation of air bubbles due to the evaporation of the volatile component, in a step of forming the device main body portion 20 on the flexible base material described below. For this reason, it is possible to prevent the flexible base material from partially rising up from the support substrate during the manufacturing, and to manufacture a high-grade organic EL device.

The flexible base material may have a multi-layer structure, and it is preferable that the flexible base material includes a barrier layer having a moisture vapor transmission rate of less than or equal to $1 \times 10^{-4}$ g/m$^2$/day, and of preferably less than or equal to $1 \times 10^{-5}$ g/m$^2$/day on the surface on a side where the device main body portion 20 is formed. Furthermore, the moisture vapor transmission rate, for example, can be measured by a calcium corrosion test.

The calcium corrosion test, for example, is a method described in Japanese Unexamined Patent Application Publication No. 2004-333127 and Japanese Unexamined Patent Application Publication No. 2005-283561. In a manufacturing method of the related art not including the removing step, in a case where the device main body portion is prepared by using the flexible base material, the barrier layer having a low moisture vapor transmission rate hardly transmits gas that is evaporated from the flexible base material, and thus, air bubbles easily remain between the support substrate and the flexible base material, compared to the case of using a flexible base material not including the barrier layer. For this reason, the flexible base material tends to more easily rise up from the support substrate. According to the manufacturing method of this embodiment including the removing step described above, even in a case where of using the flexible base material including such a barrier layer, the volatile component is reduced in advance before the forming step, and thus, it is possible to suppress the flotation described above.

<Fixing Step>

Figure 2:
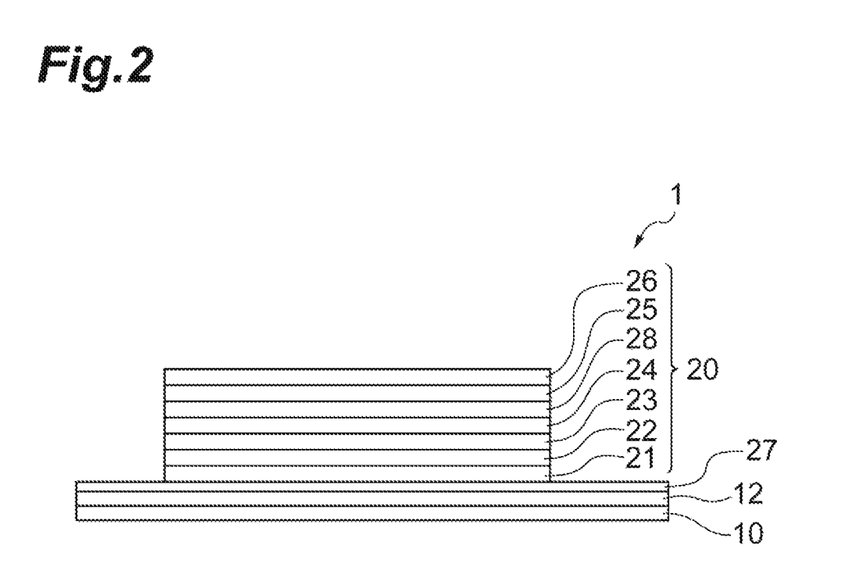
FIG. 2 is a diagram for illustrating a manufacturing method of an organic EL device according to this embodiment.

Next, as illustrated in FIG. 2, the flexible base material 27 from which the volatile component is removed, is fixed onto the support substrate 10 via the adhesive layer 12. The material of the support substrate 10 is not particularly limited insofar as the material is capable of supporting and fixing the flexible base material 27, and examples of the material of the support substrate 10 include glass, and a metal such as aluminum. The material of the adhesive layer 12 is not particularly limited insofar as the material is capable of supporting and fixing the flexible base material, and examples of the material of the adhesive layer 12 include a pressure-sensitive adhesive agent, a temperature-sensitive adhesive agent, an acrylic adhesive agent, a silicone-based adhesive agent, a silicone resin or a fluorine resin having self-adhesiveness, and the like.

Examples of a specific method of the fixing step include a method of forming the adhesive layer 12 applying an adhesive agent onto the support substrate 10, and of pasting the flexible base material 27 onto the support substrate 10. In a case where the removing step is performed by the heating or the infrared ray irradiation under a reduced pressure or under an inert gas atmosphere, the fixing step may be performed under a reduced pressure or under an inert atmosphere. As described above, by performing the fixing step, it is possible to prevent the volatile component from being absorbed again in the flexible base material 27.

Furthermore, in a case where the adhesive agent contains a solvent, or in a case where the adhesive agent contains moisture in the atmosphere, a step of removing the volatile component from the adhesive layer 12 may be performed before the fixing step. A specific method of removing the volatile component from the adhesive layer is identical to the method of removing the volatile component from the flexible base material.

<Forming Step>

After the removing step and the fixing step are performed, the positive electrode layer 21, the hole injection layer 22, the hole transport layer 23, the light emitting layer 24, the electron transport layer 28, the electron injection layer 25, and the negative electrode layer 26 are sequentially formed on the flexible base material 27 that is fixed onto the support substrate 10, and thus, the device main body portion 20 is foamed. In a step of forming each of the layers, a step of performing heating at a temperature of higher than or equal to the glass transition point of the flexible base material may be included.

In the case of performing a step of peeling off the flexible base material 27 from the support substrate 10 after the device main body portion 20 is formed, the organic EL device illustrated in FIG. 1 is obtained. However, the manufacturing method of this embodiment may not include the peeling step.

A layer configuration of the organic EL device is not limited to a layer configuration illustrated in FIG. 1. An example of the layer configuration that can be adopted in the organic EL device of this embodiment is as follows.

a) Positive Electrode Layer/Light Emitting Layer/Negative Electrode Layer b) Positive Electrode Layer/Hole Injection Layer/Light Emitting Layer/Negative Electrode Layer c) Positive Electrode Layer/Hole Injection Layer/Light Emitting Layer/Electron Injection Layer/Negative Electrode Layer d) Positive Electrode Layer/Hole Injection Layer/Light Emitting Layer/Electron Transport Layer/Electron Injection Layer/Negative Electrode Layer e) Positive Electrode Layer/Hole Injection Layer/Hole Transport Layer/Light Emitting Layer/Negative Electrode Layer f) Positive Electrode Layer/Hole Injection Layer/Hole Transport Layer/Light Emitting Layer/Electron Injection Layer/Negative Electrode Layer g) Positive Electrode Layer/Hole Injection Layer/Hole Transport Layer/Light Emitting Layer/Electron Transport Layer/Electron Injection Layer/Negative Electrode Layer h) Positive Electrode Layer/Light Emitting Layer/Electron Injection Layer/Negative Electrode Layer i) Positive Electrode Layer/Light Emitting Layer/Electron Transport Layer/Electron Injection Layer/Negative Electrode Layer (Here, a symbol "/" indicates that layers interposing the symbol "/" are laminated to be adjacent to each other.)

In addition, the hole injection layer and the electron injection layer may be configured as an inorganic layer, or may be configured as an organic layer containing an organic material.

As described above, the organic EL device has been described as an example, and according to the manufacturing method of this embodiment, it is possible to prepare an organic electronic device other than the organic EL devices, for example, an organic photoelectric conversion element, an organic thin film transistor, and the like. Further more, in such organic electronic devices, a portion excluding the flexible base material will be referred to as a device main body portion.

EXAMPLES

Next, a test result of verifying the influence of the manufacturing method of the present invention on the flexible base material will be described. Furthermore, the following test example indicates one embodiment of the present invention, and various modifications can be performed within a range not departing from the gist of the present invention.

Example 1

A flexible base material (parent resin: PEN (glass transition temperature: 155° C.)) of 50 mm square including a barrier layer having a moisture vapor transmission rate of $5 \times 10^{-6}$ g/m$^2$/day on a surface was subjected to a heating treatment in a vacuum oven at 120° C. for 1 hour (the removing step), before being fixed onto a support substrate. The flexible base material was returned to a room temperature, and then, a surface of the flexible base material on which a barrier layer was not provided was pasted to an aluminum plate that is a support substrate via an adhesive layer that is a silicone resin of which the material has self-adhesiveness, and was subjected to a heat treatment on a hot plate at 180° C. for 1 hour. Furthermore, 180° C. is a heating temperature in a case where an organic functional layer that is formed on the flexible base material by an ink jet printing method is subjected to a heat treatment. The number of air bubbles having a diameter of greater than or equal to 1 mm was counted. The results are shown in Table 1.

Comparative Example 1

A flexible base material of 50 mm square including a barrier layer having a moisture vapor transmission rate of $5 \times 10^{-6}$ g/m$^2$/day on a surface was pasted onto an aluminum plate that is a support substrate via an adhesive layer that is a silicone resin of which the material has self-adhesiveness without performing any special treatment such that a surface of the flexible base material on which the barrier layer is not provided was pasted onto the aluminum plate, and was subjected to a heat treatment on a hot plate at 180° C. for 1 hour. As with Example 1, the number of air bubbles having a diameter of greater than or equal to 1 mm was counted. The results are shown in Table 1.

TABLE 1

| | Deformation due to air bubble |
|---|---|
| Example 1 | A |
| Comparative Example 1 | B |

A: No air bubbles having a diameter of greater than or equal to 1 mm were found, and the flexible base material did not rise up from the support substrate.
B: One or more air bubbles having a diameter of greater than or equal to 1 mm were found, and the flexible base material rose up from the support substrate.

REFERENCE SIGNS LIST

1: organic EL device, 10: support substrate, 12: adhesive layer, 20: device main body portion, 21: positive electrode layer, 22: hole injection layer, 23: hole transport layer, 24: light emitting layer, 28: electron transport layer, 25: electron injection layer, 26: negative electrode layer, 27: flexible base material.

The invention claimed is:

1. A manufacturing method of an organic electronic device, comprising:
   a removing step of removing a volatile component from a flexible base material;
   a fixing step of fixing the flexible base material onto a support substrate via an adhesive layer; and
   a forming step of forming a device main body portion sequentially including a first electrode layer, at least one organic functional layer, and a second electrode layer on the flexible base material that is fixed onto the support substrate, on a side opposite to the support substrate, in this order,
   wherein a vapor pressure of the volatile component is greater than or equal to 101325 Pa within a temperature range from 20° C. to a melting point of a parent resin of the flexible base material, and wherein the forming step includes a step of performing heating at a temperature of higher than or equal to a glass transition point of the flexible base material.

2. The manufacturing method of an organic electronic device according to claim 1, further comprising:

a step of peeling off the flexible base material from the support substrate, after the forming step.

3. The manufacturing method of an organic electronic device according to claim 1, wherein the flexible base material includes a barrier layer having a moisture vapor transmission rate of less than or equal to $1\times10^{-4}$ g/m²/day, on a surface on the device main body portion side.

4. The manufacturing method of an organic electronic device according to claim 1, wherein the forming step includes a step of forming at least one organic functional layer by a coating method.

5. The manufacturing method of an organic electronic device according to claim 4, wherein the coating method is an ink jet printing method.

6. The manufacturing method of an organic electronic device according to claim 1, wherein in the removing step, the flexible base material is heated within a temperature range of higher than or equal to 20° C. and lower than the glass transition point of the flexible base material, under a reduced pressure or under an inert gas atmosphere.

7. The manufacturing method of an organic electronic device according to claim 6, wherein the fixing step is performed under a reduced pressure or under an inert gas atmosphere, after the removing step.

8. The manufacturing method of an organic electronic device according to claim 1, further comprising:

a step of removing the volatile component from the adhesive layer, before the fixing step.

* * * * *